(12) United States Patent
Hayashida et al.

(10) Patent No.: US 8,057,114 B2
(45) Date of Patent: Nov. 15, 2011

(54) WET-PROCESSING APPARATUS, WET-PROCESSING METHOD AND STORAGE MEDIUM

(75) Inventors: Yasushi Hayashida, Koshi (JP); Yoshitaka Hara, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 366 days.

(21) Appl. No.: 11/898,510

(22) Filed: Sep. 12, 2007

(65) Prior Publication Data

US 2008/0070164 A1 Mar. 20, 2008

(30) Foreign Application Priority Data

Sep. 15, 2006 (JP) .................................. 2006-250747

(51) Int. Cl.
*G03D 5/00* (2006.01)
(52) U.S. Cl. ....................................................... 396/611
(58) Field of Classification Search .................... 396/611
See application file for complete search history.

(56) References Cited

U.S. PATENT DOCUMENTS

| | | | |
|---|---|---|---|
| 7,245,348 B2 | 7/2007 | Akimoto et al. | |
| 7,255,747 B2 * | 8/2007 | Ishikawa et al. | 118/323 |
| 7,281,869 B2 | 10/2007 | Akimoto et al. | |
| 2006/0213052 A1 * | 9/2006 | Matsuoka et al. | 29/593 |
| 2007/0056514 A1 * | 3/2007 | Akimoto et al. | 118/716 |

FOREIGN PATENT DOCUMENTS

| | | |
|---|---|---|
| JP | 05-267148 | 10/1993 |
| JP | 2004-356560 | 12/2004 |
| JP | 2006-229184 | 8/2006 |

OTHER PUBLICATIONS

Japanese Office Action issued on Apr. 23, 2011 for Application No. 2006-250747 w/ English language translation.

\* cited by examiner

*Primary Examiner* — Clayton E Laballe
*Assistant Examiner* — Bret Adams
(74) *Attorney, Agent, or Firm* — Smith, Gambrell & Russell, LLP

(57) ABSTRACT

A wet-processing apparatus includes module groups each including plural processing modules and a shared nozzle device to be used in common by the processing module of the module group. The wet-processing apparatus includes plural processing modules not less than four processing modules, for example, six processing modules. The six processing modules are divided into two module groups, namely, first and second module groups each of the three processing modules. Each of the first and the second module group is provided with a nozzle device for pouring a processing solution onto a wafer. The first wafer is delivered to the first processing module, the second wafer is delivered to the processing module of the second module group, the third wafer is delivered to the processing module of the first module group. Thus the successive wafers are delivered alternately to the first and the second module groups.

10 Claims, 13 Drawing Sheets

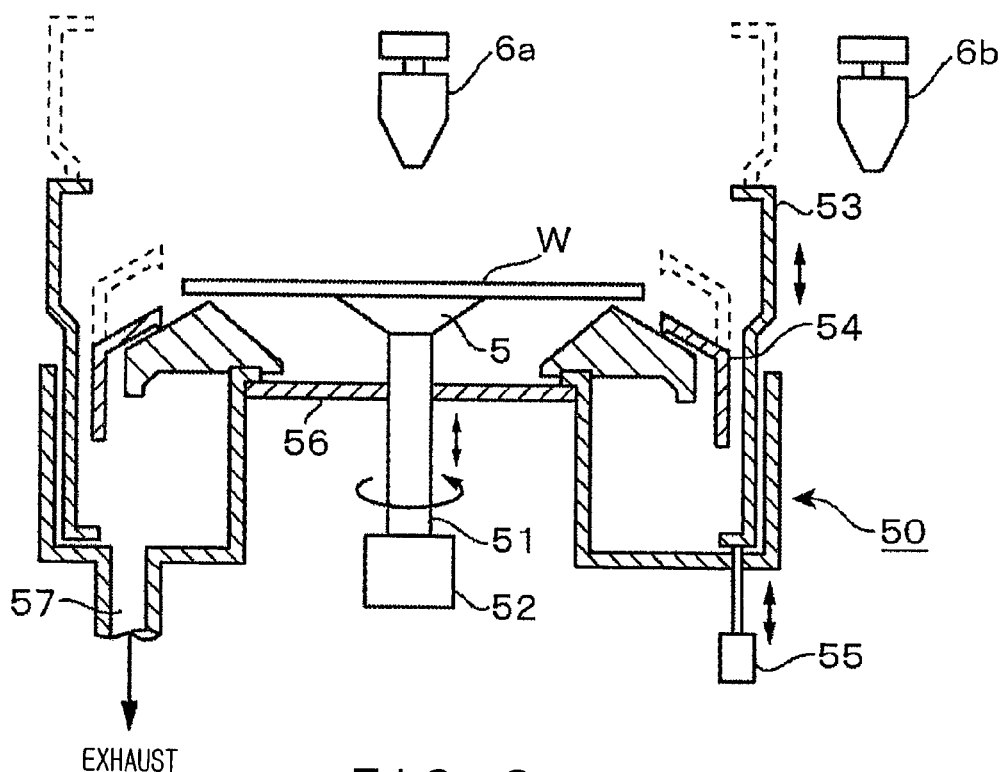
F I G. 6
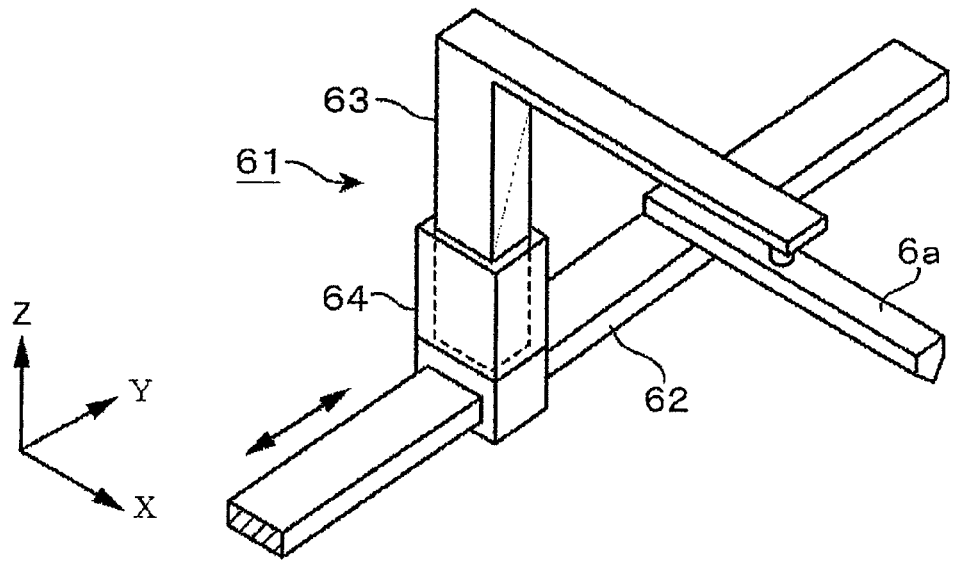
F I G. 7

WET-PROCESSING APPARATUS, WET-PROCESSING METHOD AND STORAGE MEDIUM

BACKGROUND OF THE INVENTION

1. Field of the Invention

The present invention relaters to a wet-processing apparatus and a wet-processing method for processing a substrate, such as a semiconductor wafer, by wet processes, such as a developing process, and a storage medium storing a computer program including a set of instructions for a computer to execute to carry out the wet-processing method.

2. Description of the Related Art

A resist pattern forming system for carrying out a semiconductor device fabricating process is built by connecting an exposure system to a coating and developing system. The coating and developing system has plural wet-processing units for processing a substrate by wet processes, such as a resist film forming process using a resist solution, an antireflection film forming process using an antireflection chemical solution and a developing process using a developer. The wet-processing units. Each of the wet-processing units is built by disposing a cup for preventing the scatter of a solution in a box, namely, an external case, disposing a spin chuck having a vacuum chucking function in the cup, and arranging a chemical solution spouting nozzle for spouting a chemical solution onto a substrate held on the spin chuck and a cleaning nozzle for cleaning the substrate with a cleaning liquid.

The coating and developing system has a thermal units for processing a substrate by a heating process and a cooling process before and after a substrate is processed by a wet process in the wet-processing unit, and transfer stages through which a substrate is transferred between plural carrying arms. These units and stages are called modules. Module numbers are assigned to the modules. A substrate carrying means is controlled to carry substrates according to a carrying schedule defining sequential order of the module numbers. A main arm provided with two or more carrying arms is disposed in each of processing stations in which the wet-processing units and the thermal units are disposed, respectively. The main arm receives a processed substrate from the processing unit and transfers a substrate to be processed to the processing unit according to the carrying schedule. Thus substrate replacement is performed for the processing units from the upstream toward the down stream processing units. The plural processing units are assigned to each of the processes and substrates are delivered sequentially to those processing units in increasing order of module numbers. Suppose that the coating and developing system is provided with, for example, six developing modules, substrates are carried sequentially to the six developing units in increasing order of the module numbers of the developing units.

In an invention disclosed in Patent document 1, plural wet-processing modules, for example, three wet-processing modules, use a single shared nozzle for pouring a chemical solution, and the shared nozzle is moved from one to another of the wet-processing modules to which a substrate has been delivered. Employment of the shared nozzle reduces the number of component parts, process conditions for the processing modules can be equalized, and reduces work for adjusting the shared nozzle because the single nozzle shared by the plural processing modules needs adjustment.

When intervals at which substrates are delivered to the processing modules are shortened, it sometimes occurs that a time for which each processing module needs to detain the shared nozzle is longer than those intervals. If substrates are carried sequentially to the processing modules according to the carrying schedule in such a state, it occurs that the shared nozzle is detained by the processing module holding the preceding substrate and the succeeding substrate is kept waiting in the processing module. Consequently, waiting time for which substrates are kept waiting increases cumulatively reducing the throughput of the system. Therefore, although the use of the single shared nozzle by the plural processing modules has various advantages, such a mode of use of the shared nozzle has difficulties in practical application.

Patent document 1" JP-A 5-267148 (Paragraphs 0021 and 0025, FIG. 5)

SUMMARY OF THE INVENTION

The present invention has been made under such circumstances and it is therefore an object of the present invention to provide a wet-processing apparatus including plural processing modules and a shared processing solution pouring nozzle shared by the plural processing modules, and capable of operating at a high throughput, a wet-processing method to be carried out by the wet-processing apparatus, and a storage medium storing a program including a set of instructions for a computer to execute to carry out the wet-processing method.

A wet-processing apparatus, in a first aspect of the present invention, for processing a substrate held in a horizontal position by pouring processing solutions onto the substrate, includes: plural processing modules, whose number being an even number not smaller than four, each including a substrate holding device for holding a substrate in a horizontal position and a cup surrounding the substrate holding device; nozzle devices, for pouring processing solutions onto the substrate, respectively assigned to module groups each of the same number of the processing modules and to be shared by the processing modules of each module group; nozzle moving mechanisms each for moving the nozzle device of each module group from one to another of the processing modules of the module group; substrate carrying means for delivering substrates to and receiving substrates from the processing modules; and a controller for controlling the substrate carrying means such that a succeeding one of substrates to be successively carried is carried to the processing module of the module group other than the processing module of another module group to which a preceding one of the substrates is delivered.

The followings are examples of the present invention.

a) A fixed time interval t1 at which the substrates are delivered to the processing models is shorter than a time for which the substrate is detained by the processing module; i.e., t2>t1.

b) The nozzle device includes a processing solution spouting nozzle for spouting a processing solution for a wet process, a cleaning nozzle for spouting a cleaning liquid for cleaning a substrate, and a moving member holding both the processing solution spouting nozzle and the cleaning nozzle.

c) The processing modules of each module group are disposed in one and the same box.

d) The substrate carrying means are assigned to the module groups each of the plural processing modules, respectively.

e) The module groups each of the processing modules are superposed.

f) The wet process is a developing process for pouring a developer onto a surface of a substrate coated with a resist film and processed by an exposure process.

A wet-processing method in a second aspect of the present invention, to be carried out by a wet-processing apparatus including: plural processing modules, whose number being an even number not smaller than four, each including a substrate holding device for holding a substrate in a horizontal position and a cup surrounding the substrate holding device; and nozzle devices, for pouring a processing solution onto a substrate, respectively assigned to module groups each of the even number of processing modules; includes the steps of: delivering a substrate to the processing module and holding the substrate by the substrate holding device; pouring a processing solution through the nozzle device onto the substrate to process the substrate by a wet process; delivering a succeeding substrate to a processing module of another module group other than the module group including the processing module used for processing the preceding substrate and holding the substrate by the substrate holding device; and processing the succeeding substrate by a wet process by pouring a processing solution onto the succeeding substrate through the nozzle device of another module group.

A storage medium in a third aspect of the present invention stores a computer program including a set of instructions for a wet-processing apparatus to carry out a wet-processing method including the steps of holding a substrate in a horizontal position by a substrate holding device and pouring a processing solution onto the substrate to process the substrate by the wet-processing method.

According to the present invention, the wet-processing apparatus has the plural processing modules each including the substrate holding device and the cup, and the processing modules uses the nozzle device in common, and the substrates are not delivered successively to the processing modules of each module group. Therefore, a time for which the succeeding substrate carried to the processing module is kept waiting while the nozzle device is used for processing the preceding substrate in the same processing module can be reduced. Consequently, the wet-processing apparatus operates at a high throughput and can make the effective use of the advantages of using the nozzle device by the plural processing modules in common.

BRIEF DESCRIPTION OF THE DRAWINGS

FIG. 6 is a sectional view of a developing module included in the developing unit;

FIG. 7 is a perspective view of a nozzle device included in the developing unit;

DESCRIPTION OF THE PREFERRED EMBODIMENTS

Figure 1:
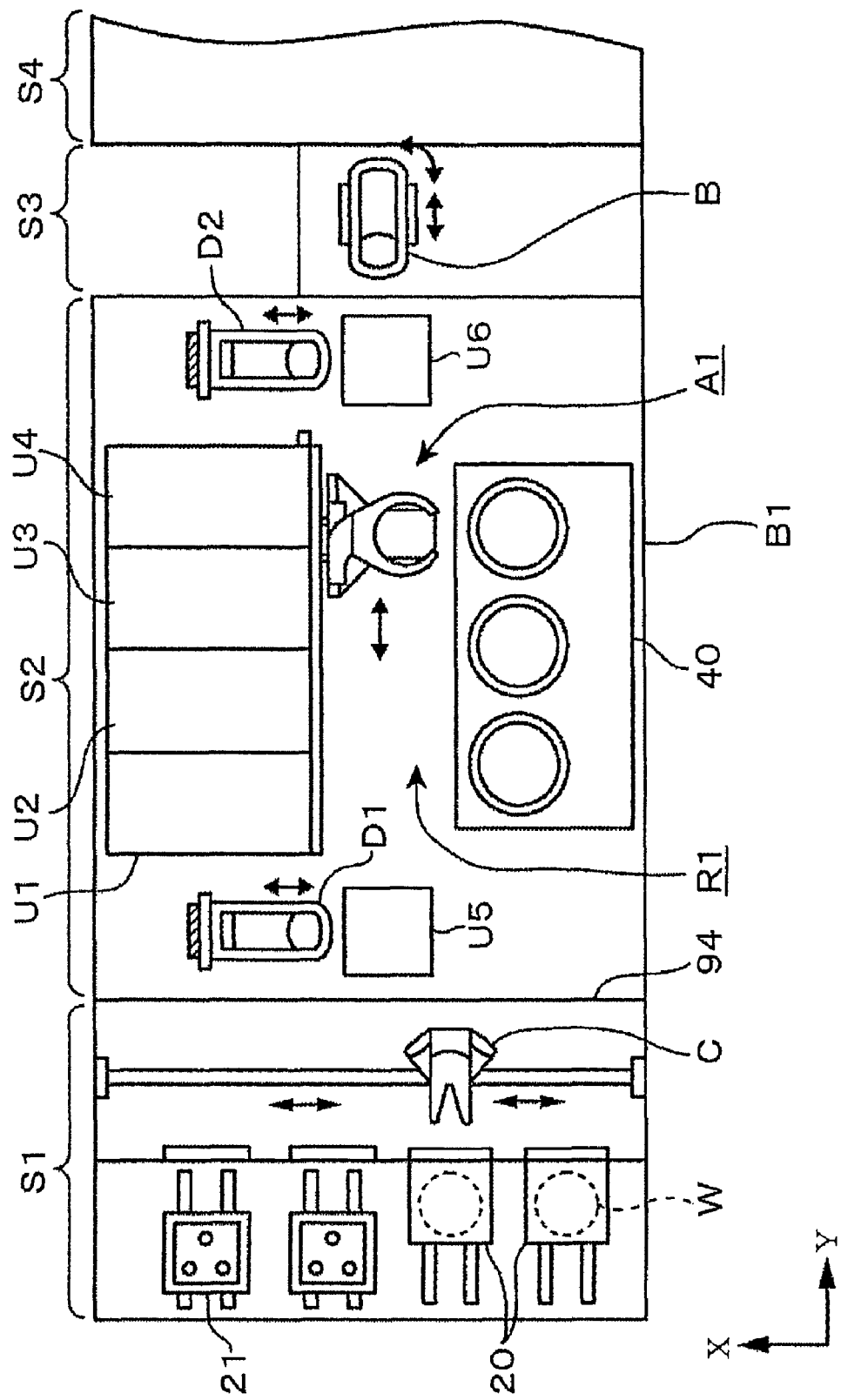
FIG. 1 is a plan view of a coating and developing system in a first embodiment according to the present invention.
Figure 2:
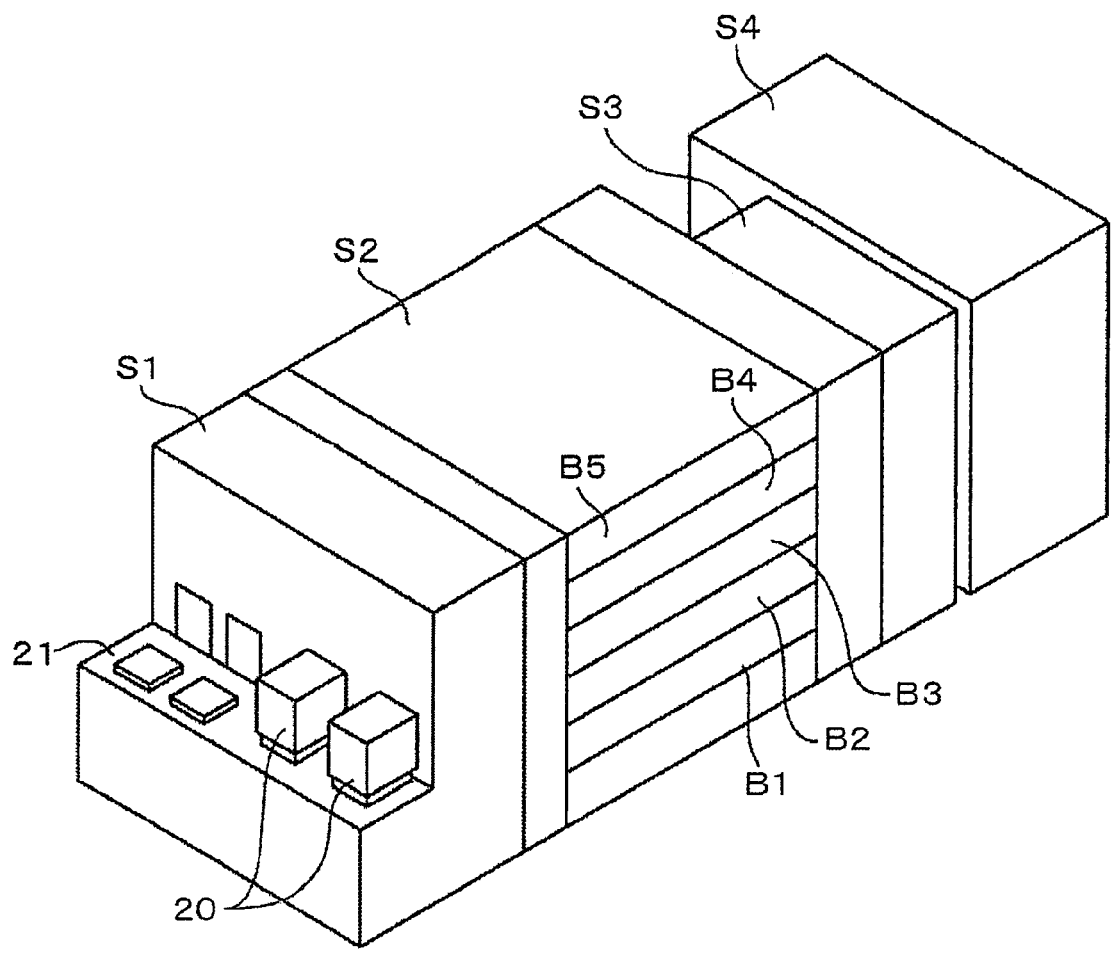
FIG. 2 is a perspective view of the coating and developing system shown in FIG. 1.
Figure 3:
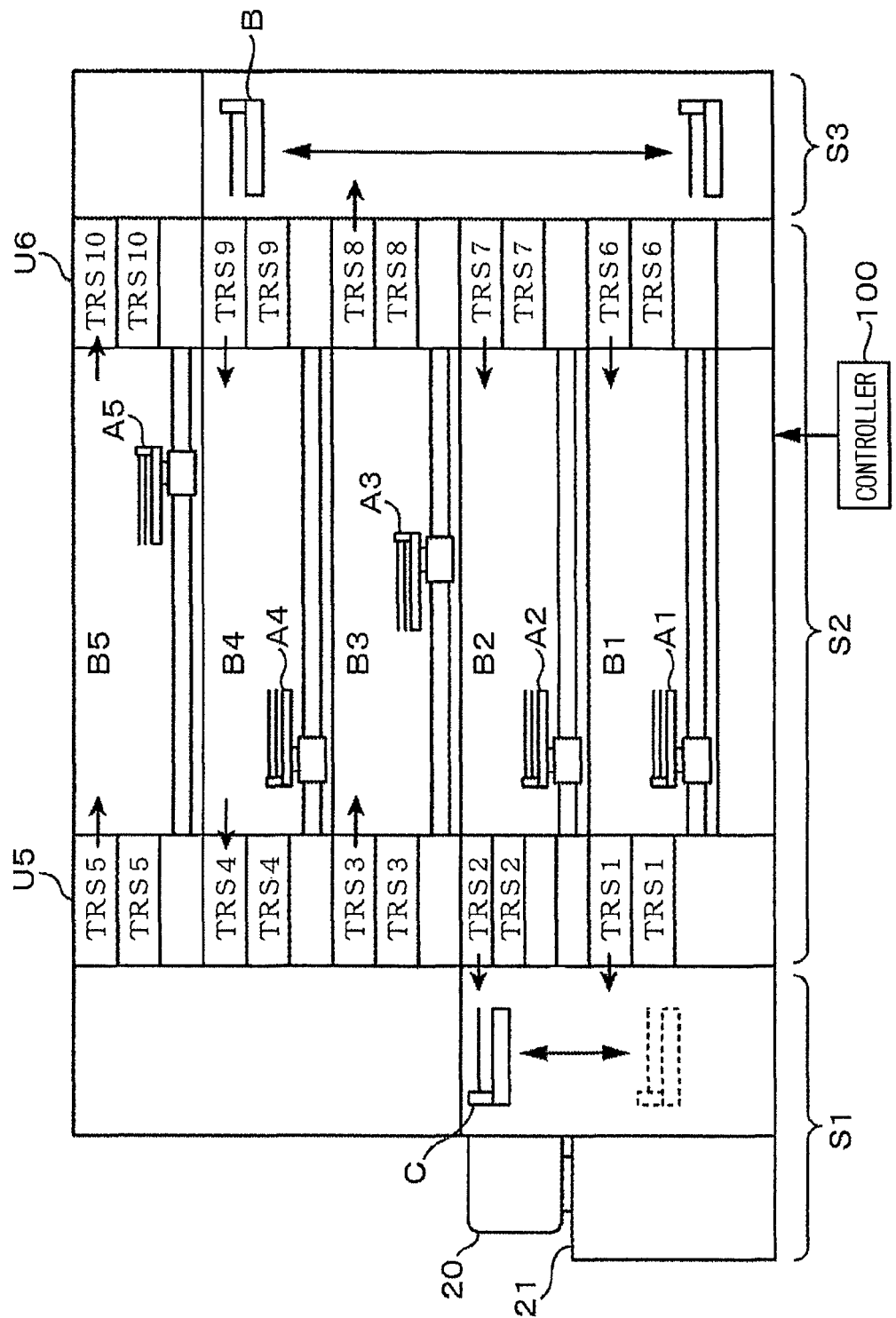
FIG. 3 is a sectional side elevation of the coating and developing system shown in FIG. 1.

Constitution of Coating and Developing System Provided with Wet-Processing System A developing apparatus, for processing a semiconductor wafer (hereinafter, referred to simply as "wafer") processed by an exposure process, in a first embodiment of the present invention will be described. First, a coating and developing system including developing units will be briefly described with reference to FIGS. 1 to 3. FIGS. 1, 2 and 3 are a plan view, a schematic perspective view and a schematic side elevation, respectively, of a coating and developing system. The coating and developing system has a carrier block S1. The carrier block S1 is provided with carrier tables 21 on which closed carriers 20 containing wafers W are supported. A transfer arm C takes out the wafers W from the carrier 20 and transfers the wafer W to a processing block S2. The transfer arm C receives a processed wafer W from the processing block S2 and returns the processed wafer W to the carrier 20.

As shown in FIG. 2, the processing block S2 is built by stacking up a first block B1, namely, a DEV layer for processing a wafer W by a developing process, a second block B2, namely, a DEV layer for processing a wafer W by a developing process, a third block B3, namely, a TCT layer for forming an antireflection film overlying a resist film, a fourth block B4, namely, a COT layer for forming a resist film, and a fifth block B4, namely, a BCT layer for forming an antireflection film underlying the resist film in that order.

The third block (TCT layer) B3 and the fifth block (BCT layer) B5 have coating units, heating and cooling units, and carrying arms A3 and A5, respectively. The coating unit coats a surface with a chemical solution for forming an antireflection film by a spin coating process. The heating and cooling units carry out a pretreatment before a wafer W is processed by a process by the coating unit and a posttreatment after a wafer W has been processed by a process by the coating unit. The carrying arms A3 and A5 transfers wafers W among those units.

The third block B3 and the fifth block B5 are similar in construction to the fourth block (COT layer) B4, except the fourth block B4 uses a resist solution. The first block (DEV layer) B1 and the second block (DEV layer) B2 are similar in construction to the fourth block B4, except that the first block B1 and the second block B2 use a developer.

Referring to FIGS. 1 and 3, the processing block S2 has a shelf unit U5. A wafer W received from the carrier block S1 is placed on one of transfer stages included in the shelf unit U5. A vertically movable first transfer arm D1 installed near the shelf unit U5 carries wafers W successively from the shelf unit U5 to transfer stages TRS5 included in the fifth block (BCT layer) B5. The carrying arm A5 of the fifth block (BCT layer) B5 receives wafers W from the transfer stages TRS5 of the shelf unit U5 and carries the wafers W to the processing units, namely, antireflection film forming units and heating and cooling units. These processing units form an antireflection film on the wafers W.

Subsequently, the wafer W is carried through a transfer stage TRS10 included in a shelf unit U6, a vertically movable second transfer arm D2 a transfer stage TRS9 included in the shelf unit U6, and a carrying arm A4 to the fourth block (COT layer) B4 to form a resist film on the wafer W. Then, the wafer W is transferred through the carrying arm A4, the transfer stage TRS9 of the shelf unit U6, and the second transfer arm D2 to a transfer stage included in the shelf unit U6 within reach of an interface arm B. In some cases, another antireflection film is formed on the wafer W coated with the resist film by the third block (TCT layer) B3.

Then, the interface arm B carries the wafer W to an exposure system S4 to process the wafer W by an exposure process. The wafer W processed by the exposure process is returned to the transfer stage of the shelf unit U6. Then, the wafer W is processed by a developing process by the first block (DEV layer) B1 or the second block (DEV layer) B2. Then, a carrying arm A1 included in the first block B1 or a carrying arm A2 included in the second block B2 carries the wafer W to a transfer stage TRS1 (or TRS2) included in the shelf unit U5. Subsequently, the transfer arm C returns the wafer W to the carrier 20.

In FIGS. 1 to 3, indicated at U1 to U4 are thermal units each formed by stacking up cooling devices and heating devices, and at TRS3, TRS4, and TRS6 to TRS8 are transfer stages.

Figure 4:
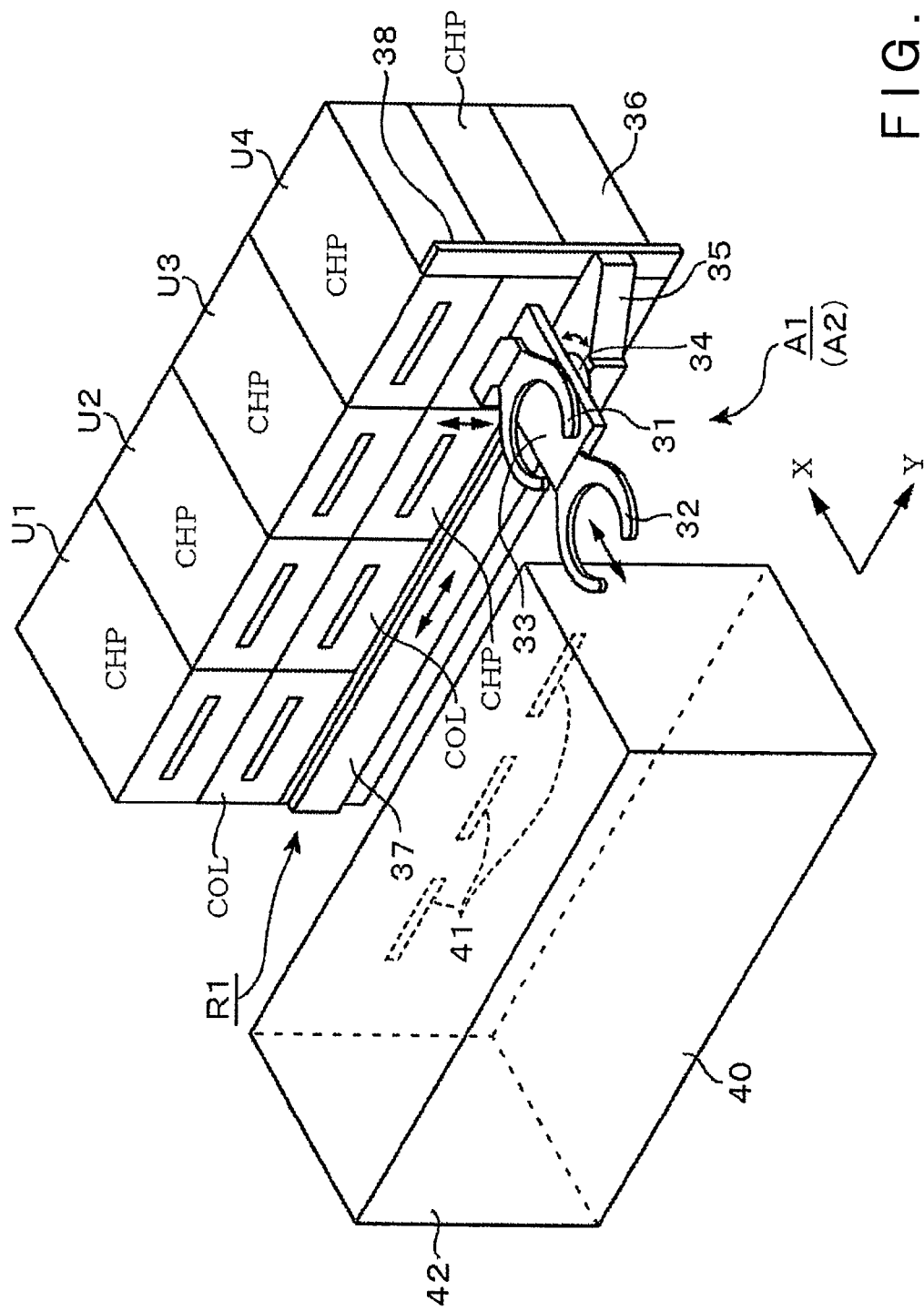
FIG. 4 is a perspective view of a coating unit, a thermal unit and a substrate carrying device included in the coating and developing system shown in FIG. 1.

The first block (DEV layer) B1, the second block (DEV layer) B2 and peripheral devices will be described. The first block (DEV layer) B1 and the second block (DEV layer) B2 are provided with developing units, which are important parts of this embodiment. FIG. 4 shows the first block (dev layer) B1 (second block (DEV layer) B2) in a schematic perspective view. As shown in FIG. 4, the first arm A1 of the first block (dev LAYER) B1 (the second arm A2 of the second block (DEV layer) B2) is provided with two arms 31 and 32. A peripheral part of the back surface of a wafer W is seated on each of the arms 31 and 32. The arms 31 and 32 can be individually advanced and retracted along a base 33. The base 33 can be turned by a turning mechanism 34 about a vertical axis and can be moved by a moving mechanism 35 along a Y-axis rail 37 in directions parallel to the Y-axis. The Y-axis rail 37 is attached to a surface of a base 36 on which the thermal units U1 to U4 are installed facing a carrying region R1. The base 33 can be vertically moved along a vertical rail 38. Thus the arms 31 and 32 that can be advanced and retracted, can be moved along the directions parallel to they axis, can be vertically moved and can be turned about a vertical axis, can carry wafers W to and receive wafers W from the units of the thermal units U1 to U4, namely, heating units (CHP) and cooling units (COL), the transfer stages TRS1 (or TRS2) of the shelf unit U5, the transfer stage TRS6 (or TRS7) of the shelf unit U6 and a developing unit 40, which will be described later.

Figure 5:
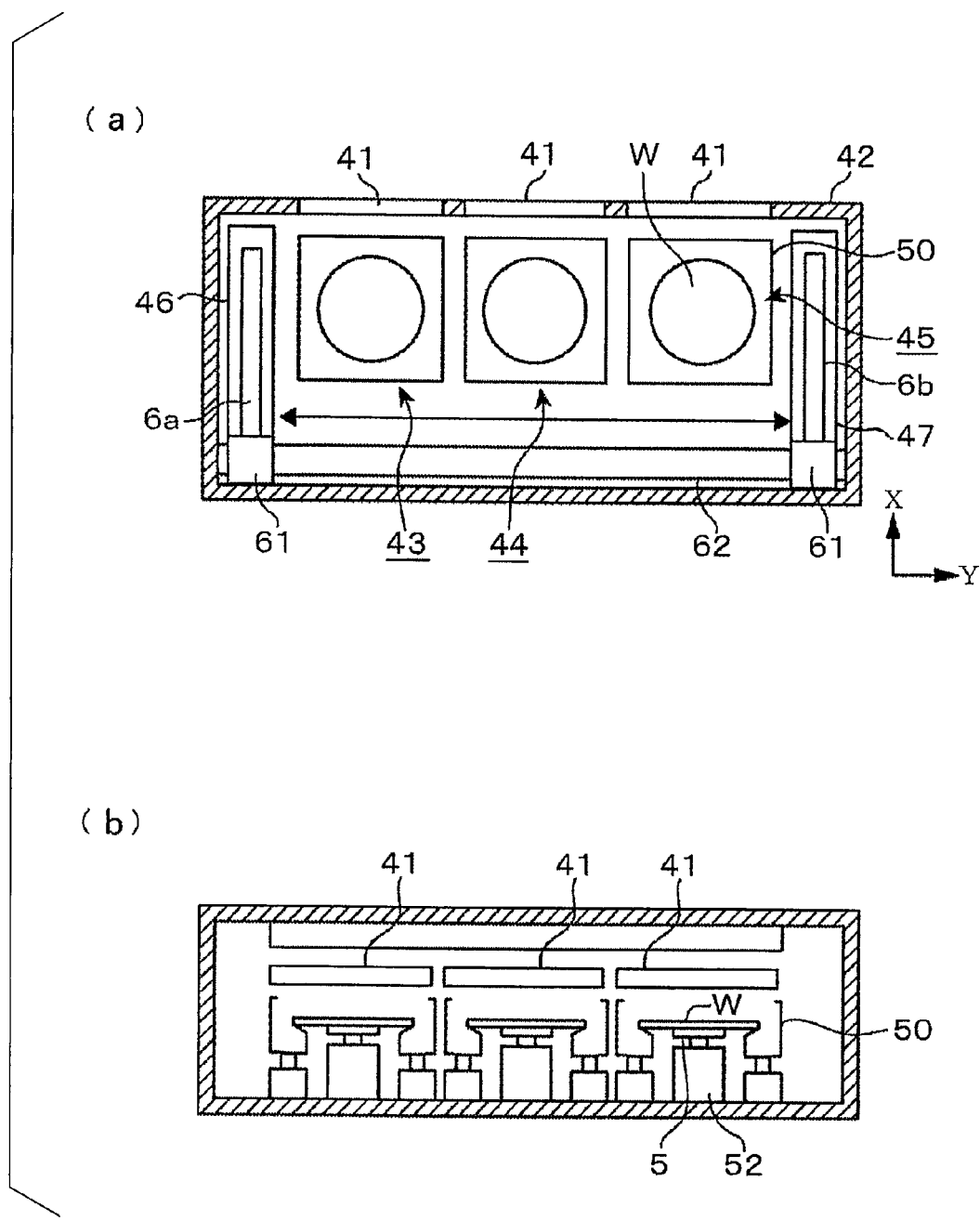
FIGS. 5A and 5B are a cross-sectional plan view and a longitudinal sectional view, respectively, of a developing unit included in the coating and developing system shown in FIG. 1.

The developing unit 40 will be described. The first block (DEV layer) B1 and the second block (DEV layer) B2 are the identical in construction and hence only the first block B1 will be described. Referring to FIGS. 4 and 5, the developing unit 40 has a box 42 provided with three entrances 41, three developing devices 43, 44 and 45 arranged in a longitudinal direction parallel to the Y-axis, a developing nozzle 6a and a cleaning nozzle 6b. The developing nozzle 6a and the cleaning nozzle 6b are shared by the developing devices 43, 44 and 45.

The developing devices 43, 44 and 45 identical in construction and hence only the developing device 43 is shown in FIG. 6 by way of example. Referring to FIG. 6 a spin chuck 5, namely, a substrate holding device, attracts a central part of the back surface of a wafer W, namely, a substrate, by suction to hold the wafer W thereon in a horizontal position. The spin chuck 5 is held on a shaft 51, which is driven for rotation by a driving mechanism 52.

A cup unit 50 having an open upper end is disposed so as to surround the wafer W held by the spin chuck 5. The cup unit 50 includes an outer cup 53 having an upper part having the shape of a rectangular cylinder and a lower part having the shape of a circular cylinder, and a cylindrical inner cup 54 having an upward tapered upper part. A lifting device 55 is connected to the lower end part of the outer cup 53 to move the outer cup 53 vertically. The inner cup 54 is moved vertically by the outer cup 53. Lifting pins, not shown, are extended vertically through a circular plate 56. The lifting pins move the wafer W placed thereon vertically. The lifting pins and the carrying arm A1 (A2) cooperate to transfer a wafer W to and to receive the same from the spin chuck 5. In FIG. 6, indicated at 57 is a drain port.

The developing nozzle 6a is provided in its lower wall with plural developer pouring openings. The developer pouring openings are arranged in a line of a length corresponding to the diameter of the wafer W. As shown in FIGS. 5 and 7, the developing nozzle 6a can be moved by a moving mechanism 61 between each of the three developing devices 43, 44 and 45, and a home position 46 at one end of the box 42. The moving mechanism 61 includes a longitudinal guide rail 62 extended parallel to the Y-axis, a moving member 63 guided by the guide rail 62, and a lifting mechanism 64 combined with the moving member 63. Thus the developing nozzle 6a can be moved longitudinal directions parallel to the Y-axis and vertical directions parallel to the Z-axis. The cleaning nozzle 6b, similarly to the developing nozzle 6a, is provided in its lower wall with plural cleaning liquid pouring openings arranged in a line of a length corresponding to the diameter of a wafer W. The cleaning nozzle 6b can be moved by a moving mechanism between each of the three developing devices 43, 44 and 45, and a home position 47 at the other end of the box 42.

As shown in FIG. 3, the coating and developing system is provided with a controller 100, namely, a computer. The controller 100 is capable of controlling a carrying system and the processing units according to a program stored in a storage device, not shown. The carrying system includes the transfer arm C, the first transfer arm D1, the second transfer arm D2, the carrying arms A1 to A5 of the layers, and the interface arm B. The wafer W processed by the exposure process is carried to the developing unit 40 of the first block (DEV layer) B1 or the second block (DEV layer) B2. The program specifies steps such that wafers W processed by the exposure process are carried alternately to the developing unit 40 of the first block B1 and the developing unit 40 of the second block B2. The program is stored in a storage medium, such as a flexible disk (FD), a memory card, a compact disk OCD), a magnetooptical disk (MO) or a hard disk and is installed in the controller 100, namely, the computer.

The shelf unit U6, the interface arm B, the first block (DEV layer) B1, the second block (DEV layer) B2 and the controller 100 form the wet-processing apparatus of the present invention, and the developing devices 43, 44 and 45 are processing modules. The present invention divides an even number of processing modules not less than four processing modules into groups each including the same number of processing modules. In this embodiment, the first block (DEV layer) B1 is a first group including the developing devices 43, 44 and 45, and the second block (DEV layer) B2 is a second group including the developing devices 43, 44 and 45. A condition "division of an even number of processing modules not less than four processing modules into groups each including the same number of processing modules" specified by the present invention is dividing the six processing modules into first and second groups each including the three processing modules and placing the first and the second group in the first and the second layer, respectively. The developing nozzle 6a and the cleaning nozzle 6b are shared nozzles used for a wet process by the processing modules of each group in common.

Operation and Effect of the Wet-Processing Apparatus

The operation of the developing apparatus corresponding to the wet-processing apparatus of the present invention will be described. As mentioned above in connection with the related art, a wafer W taken out of a carrier 20 is carried sequentially to the processing modules (support parts on which the wafer W is supported) of the coating and developing system and is carried to an interface block S3 according to the carrying schedule. The wafer W is processed by an exposure process by the exposure system S4, and then the wafer W is returned to the interface block S3. Then, the wafer W carried sequentially to the processing modules and is returned into the carrier 20. Practically, the carrying schedule is a table showing the correspondence of wafers W and numbers assigned to the processing modules for each of carrying cycles, namely, phases. The controller 100 reads the carrying schedule to find to which processing modules the wafer W is to be carried in order of carrying cycles, gives instructions to the substrate carrying means including the first transfer arm D1 to accomplish one carrying cycle. Subsequently, the controller 100 reads information about the relation between the wafer W and the processing module for the next carrying cycle. Thus the wafer W is carried from one to another of the processing modules.

The wafers W processed by the exposure process are received successively by the interface arm B. Then, the successive wafers W are transferred alternately to the first block B1 and the second block B2 such that the leading wafer W is transferred to the transfer stage TRS6, the second wafer W is transferred to the transfer stage TRS7 and the third wafer W is transferred to the transfer stage TRS6.

Figure 8:
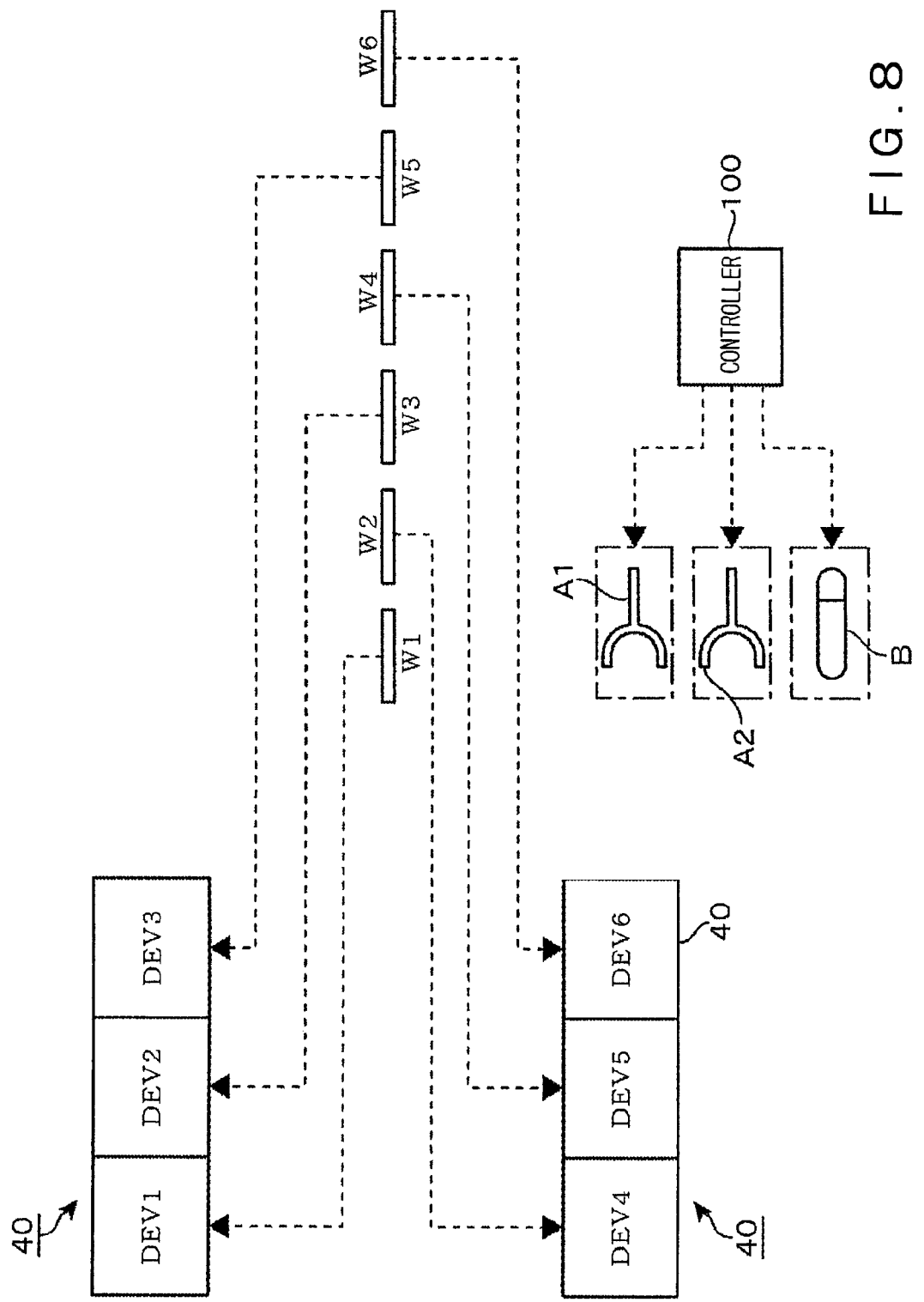
FIG. 8 is a diagrammatic view of assistance in explaining a delivery mode in which wafers are delivered to the developing modules of the developing units in the coating and developing system shown in FIG. 1.

In the following description, the three developing devices 43, 44 and 45 of the developing unit 40 of the first block B1 are referred to as processing modules DEV1, DEV2 and DEV3, and the three developing devices 43, 44 and 45 of the developing unit 40 of the second block B2 are referred to as processing modules DEV4, DEV5 and DEV6. Suppose that six wafers W1 to W6 are transferred from the exposure system S4 to the interface block S3, and the interface arm B carries the wafers W1 to W6. As shown in FIG. 8, the carrying arm A1 of the first block B1 receives the first wafer W1 from the transfer stage TRS6 and carries the wafer W1 to the processing module DEV1. The carrying arm A2 of the second block B2 receives the second wafer W2 from the transfer stage TRS7 and carries the wafer W2 to the processing module DEV4. Thus the third wafer W3 to the sixth wafer W6 are carried to the processing modules DEV2, DEV5, DEV3 and DEV6, respectively. The controller 100 controls the interface arm B, and the carrying arms A1 and A2 to carry the wafers W1 to W6 in the foregoing delivery mode.

To transfer the wafer W from the interface arm B to the carrying arm A1 or A2, the interface arm B may transfer the wafer W to a transfer stage other than the transfer stages TRS6 and TRS7, and the second transfer arm D2 may transfer the wafer W from the transfer stage to the transfer stage TRS6 or TRS7.

The lifting pins, not shown, operates for transferring the wafer W between the carrying arm A1 or A2 and the spin chuck 5. After the wafer W has been transferred to the spin chuck 5, the developing nozzle 6a moves from one to the other end of the wafer W pouring the developer onto the wafer W to form a developer film on the wafer W and, at the same time, the outer cup 53 and the inner cup 54 are raised. The developing nozzle 6a is moved outside the outer cup 53. After the passage of a predetermined developing time since the coating of the surface of the wafer W with the developer, the cleaning nozzle 6b is moved over the surface of the wafer W from one to the other end of the wafer W pouring a cleaning liquid onto the wafer W. This operation is repeated plural times to replace the developer with the cleaning liquid.

Then, the spin chuck 5 is rotated to shake the cleaning liquid off the wafer W, and the spin chuck 5 is rotated continuously after the cleaning liquid has been shaken off the wafer W to dry the wafer W. Then, the foregoing carrying steps are reversed to transfer the dried wafer W to the carrying arm A1 or A2. Then, the wafer W is carried to the transfer stage TRS1 or TRS2 of the shelf unit U5. After the termination of spouting the cleaning liquid through the cleaning nozzle 6b, the developing nozzle 6a and the cleaning nozzle 6b are released from detention in the processing module that processed the wafer W, for example, the processing module DEV1, and can be moved to another processing module expected to carry out the next processing cycle.

Figure 9:
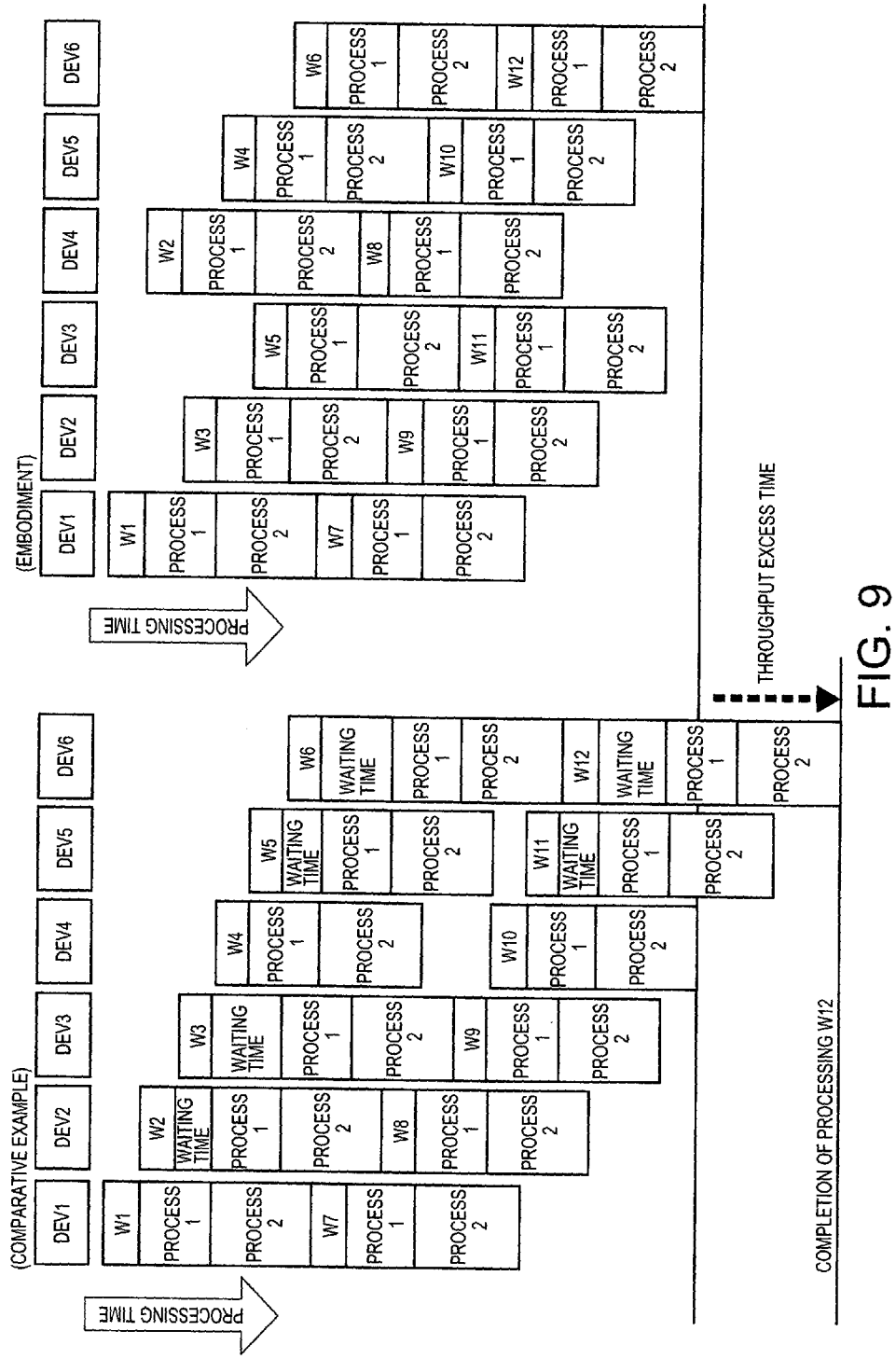
FIG. 9 is a diagram of assistance in explaining residence times during which wafers successively carried to developing modules of the developing unit stay in the developing modules.

A diagram on the right-hand side in FIG. 9 shows a state of residence of wafers W1 to W12 at the processing modules DEV1 to DEV3 of the developing unit 40 of the first block B1 and the processing modules DEV4 to DEV6 of the developing unit 40 of the second block B2 when the wafers W1 to W12 are delivered in a delivery mode according to the present invention and are processed by the foregoing processes. In FIG. 9, a process 1 includes a step of pouring the developer through the developing nozzle 6a onto the wafer W, a step of keeping a state where the wafer W is coated with the developer for a predetermined time, and a step of pouring the cleaning liquid through the cleaning nozzle 6b onto the wafer W to clean the wafer W, and a process 2 is a drying process for drying the surface of the wafer W.

For example, when the wafer W3 is carried to the processing module DEV2 after the wafer W1 carried to the processing module DEV1 has been processed, the process 1 is completed; that is, the cleaning process of cleaning the wafer W1 by spouting the cleaning liquid through the cleaning nozzle 6b onto the wafer W1 is completed. Therefore, the developing nozzle 6a and the cleaning nozzle 6b are released from the processing module DEV1 and can be immediately used for processing the wafer W3 by the developing process. The wafers W2 and W4 to W12 can be processed in the foregoing processing mode. The developing process using the developing nozzle 6a and the cleaning nozzle 6b can be started for all the wafers W immediately after the wafers W have been delivered to the processing modules DEV1 to DEV6 without any delay.

A diagram on the left-hand side in FIG. 9 shows a state of residence of wafers W1 to W6 at the processing modules DEV1 to DEV6 when the wafers W1 to W1 are delivered in that order to the processing modules DEV1 to DEV6 in order of the number of the processing modules DEV1 to DEV6 in a comparative delivery mode. When the wafers W1 to W6 are delivered to the processing modules DEV1 to DEV6 in the comparative delivery mode, the wafers W1 to W3 are delivered in that order to the processing modules DEV1 to DEV3 in order of the number of the processing modules DEV1 to DEV3, and the wafers W4 to W6 are delivered in that order to the processing modules DEV4 to DEV6 in order of the number of the processing modules DEV4 to DEV6. For example, when the second wafer W2 is carried to the processing module DEV2, the first wafer W1 is being processed by the process 1 in the DEV1. Since the developing nozzle 6a and the cleaning nozzle 6b are in use by the DEV1, the DEV2 cannot use the developing nozzle 6a and the cleaning nozzle 6b and the second wafer W2 is kept unprocessed until the process 1 is completed, i.e., until pouring the cleaning liquid through the cleaning nozzle 6b is completed.

When the process 1 for processing the wafer W2 is started after the process 1 for processing the wafer W1 has been completed, the third wafer W3 is delivered to the processing module DEV3. Since the developing nozzle 6a and the cleaning nozzle 6b are employed exclusively in processing the wafer W2 at this stage, the wafer W3 is inevitably kept waiting until the process 1 for processing the wafer W2 is completed. Such waiting time is inevitable also to the processing modules DEV4 to DEV6 of the developing unit 40 of the second block B2. Since the fourth wafer W4 is being processed by the processing module DEV4 when the fifth wafer W5 is delivered to the processing module DEV5, the fifth wafer W5 is kept waiting in the processing module DEV5 until the process for processing the fourth wafer W4 is completed. The same problem arises when the sixth wafer W6 is delivered to the processing module DEV6. The sixth wafer W is kept waiting until the process for processing the fifth wafer W5 is completed. Also the eleventh wafer W11 and the twelfth wafer W12 are kept waiting before being processed because the processing module DEV5 or DEV6 cannot use the developing nozzle 6a and the cleaning nozzle 6b. Consequently, the completion of the process for processing the twelfth wafer W12 is delayed.

In the foregoing first embodiment, when the two developing units 40 each including the three processing modules are used, the wafers W are delivered alternately to the processing module of one of the developing units 40 and the processing module of the other developing unit 40 instead of delivering the wafers sequentially to the processing modules of one of the developing units 40 and to the processing modules of the other developing units in order of the number of the processing modules. As obvious from FIG. 9, it does not occur that the wafer W is kept unprocessed for waiting time while the shared nozzles 6a and 6b are used for processing another wafer W, and hence the developing units 40 can operate at a high throughput; that is, the developing unit 40 using the shared nozzles 6a and 6b can operate without reducing throughput. Thus it is possible to make the effective use of the advantages of using the shared nozzles 6a and 6b by the plural processing modules in common.

Suppose that the present invention delivers the wafers W of the successive numbers at wafer delivering intervals t1 and the developing nozzle 6a and the cleaning nozzle 6b need to be used for a processing time t2 to process the wafer W by the process 1 by the processing module. The method of the present invention is effective when t2>t1. In the foregoing embodiment, the processing time t2=2×t1 and hence the wafers W are not kept waiting at any processing modules. The present invention is applicable also to a method that needs waiting time. The throughput when the wafers W are processed by the method of the present invention is higher than that when the wafers W are delivered to the processing modules in order of the numbers of the processing modules.

Other Embodiments

Figure 10:
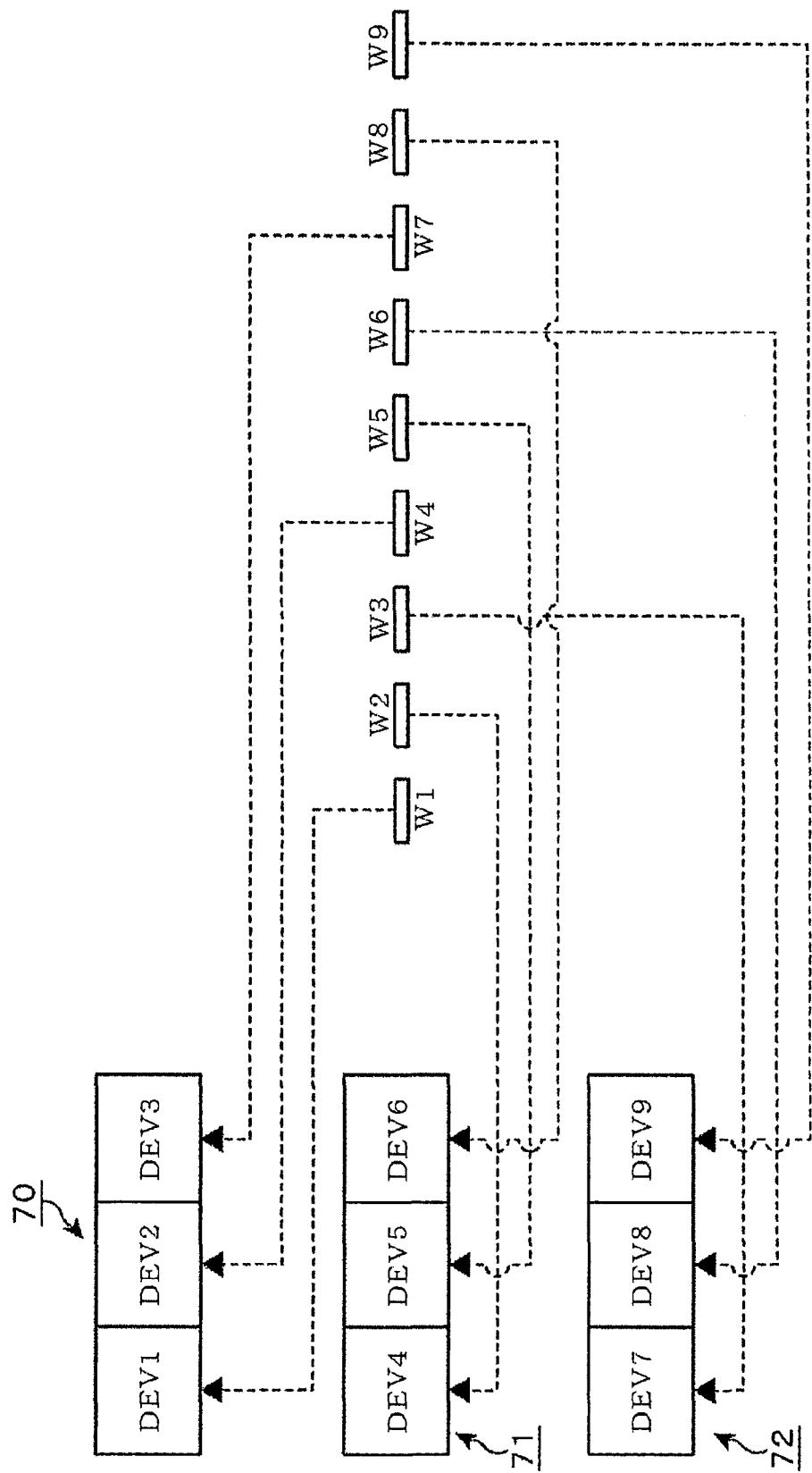
FIG. 10 is diagrammatic view of assistance in explaining a delivery mode of delivering wafers to developing modules of a developing unit included in a coating and developing unit in a second embodiment according to the present invention.

The present invention is applicable to a coating and developing system provided with three developing units each including three processing modules. FIG. 10 is a diagrammatic view of assistance in explaining a delivery mode of delivering wafers to the developing modules of the developing units in a coating and developing system having three developing units each provided with three processing modules. Wafers are carried to developing units 70, 71 and 72 in order of the numbers of the developing units 70, 71 and 72. that is, the first wafer W1, the second wafer W2, the third wafer W3 and the fourth wafer W4 are delivered to a processing module DEV1 included in the developing unit 70, a processing module DEV4 included in the developing unit 71, a processing module DEV7 included in the developing unit 72, and the processing module DEV2 included in the developing unit 70, respectively.

The third wafer W3 may be delivered to the processing module DEV2, and the fourth wafer W4 may be delivered to the processing module DEV7. Thus the wafers W may be delivered to any processing modules, provided that the succeeding one of the successive wafers W is delivered to the processing module of the developing unit other than the unit including the processing module to which the preceding one of the successive wafers W has been delivered.

According to the present invention, when the plural processing modules are divided into groups, the processing modules of each group do not need constitute a developing unit provided with one box. For example, the four processing modules are placed in a shared box in two groups, and the developing nozzle 6a and the cleaning nozzle 6b may be assigned to each of the groups. The two groups each provided with the developing nozzle 6a and the cleaning nozzle 6b are disposed in one and the same box.

Figure 11:
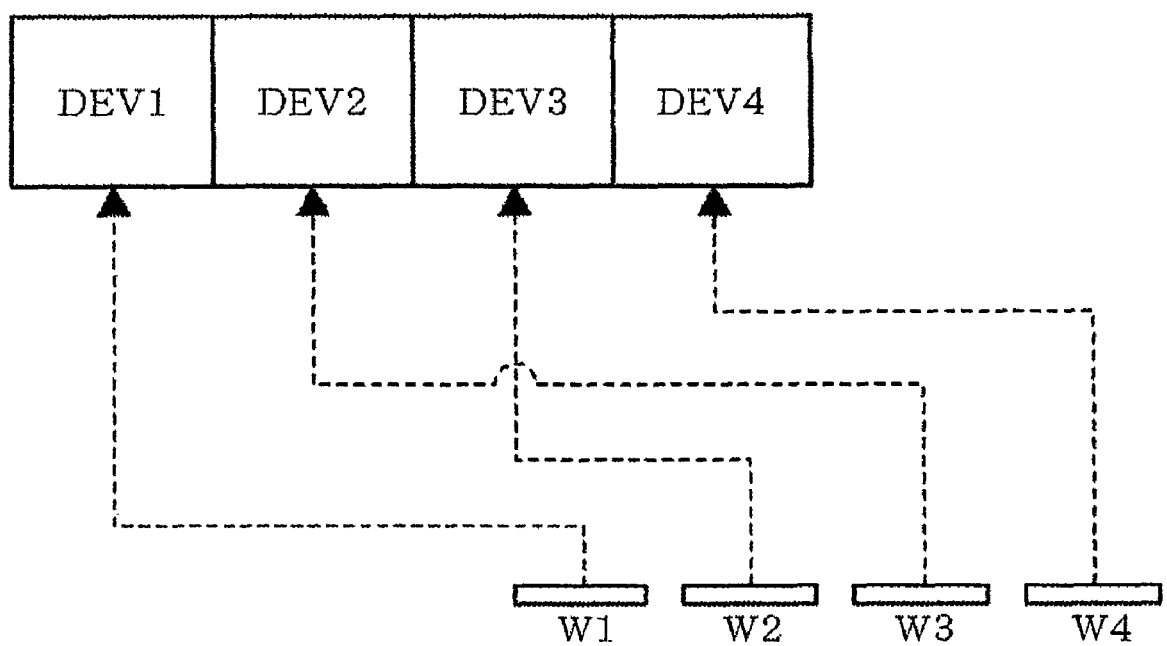
FIG. 11 is diagrammatic view of assistance in explaining a delivery mode of delivering wafers to developing modules of a developing unit included in a coating and developing unit in a third embodiment according to the present invention.

FIG. 11 shows a delivery mode of successively delivering wafers W to processing modules DEV1 and DEV2 sharing a shared nozzle device including a developing nozzle 6a and a cleaning nozzle 6b and to processing modules DEV3 and DEV4 sharing a shared nozzle device including a developing nozzle 6a and a cleaning nozzle 6b. After the four wafers W1 to W4 have been delivered in that order to the processing modules DEV1 to DEV4, the fifth and the following wafers W are delivered in that order to the processing modules DEV1 to DEV4. This delivery mode has the same effect as the foregoing delivery modes according to the present invention.

The wet-processing apparatus of the present invention is not limited to the developing apparatus. For example, the present invention is applicable to an apparatus that applies a coating solution, such as a chemical solution prepared by dissolving a precursor of an insulating film, to a wafer in a single-stroke drawing manner in, for example, a spiral shape or to a coating method of applying a coating solution to a wafer in plural parallel straight lines.

Another Coating and Developing System Employing the Wet-Processing Apparatus

Figure 12:
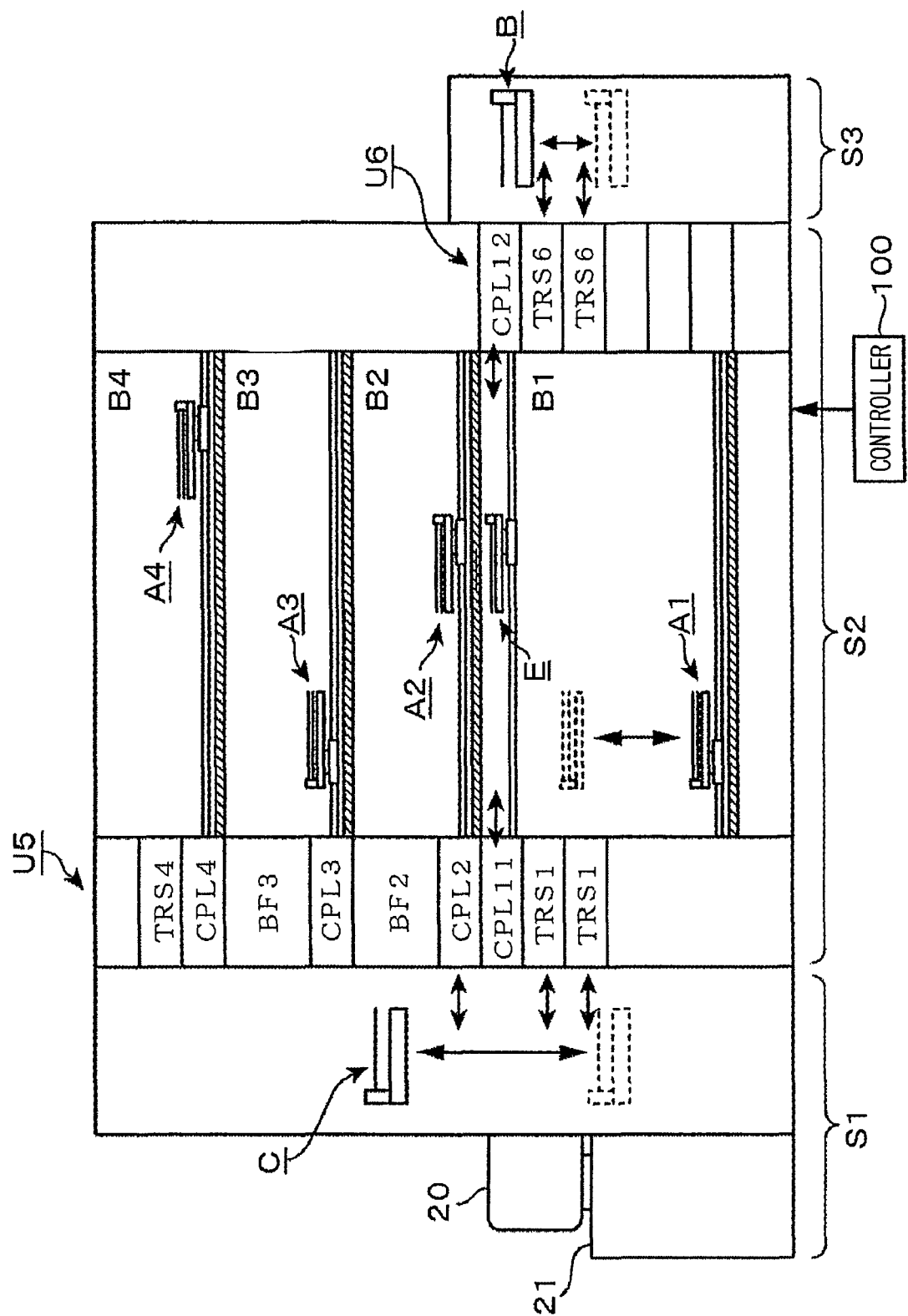
FIG. 12 is a sectional side elevation of a coating and developing unit in a fourth embodiment according to the present invention.

A coating and developing system in a second embodiment differs from the coating and developing system in the first embodiment described in connection with FIGS. 1 to 3 in the following aspects. The coating and developing system in the second embodiment is not provided with any device corresponding to the transfer arm D2. Whereas the DEV layers B1 and B2 of the coating and developing system in the first embodiment are stacked in layers, the coating and developing system in the second embodiment has a single DEV layer B1 provided with two developing units 40 stacked up in layers. The DEV layer B1 is provided with a carrying arm A1 for carrying wafers W to the two developing units 40. A shuttle arm E is placed in an upper part of the DEV layer B1. The shuttle arm E carries a wafer W from a transfer unit CPL11 included in a shelf unit U5 directly to a transfer unit CPL12 included in a shelf unit U6. A wafer W is transferred from one to another of a second block (BCT layer) B2 to a fourth block (TCT layer) B4, and a wafer W processed by the third block (COT layer) B3 or a wafer W processed by the second block (BCT layer) B2 and the fourth block (TCT layer) B4 are carried to a transfer unit CPL11 by a first carrying arm D1. The wafer W is carried from the transfer unit CPL11 directly to the transfer unit CPL12 of the shelf unit U6 by the shuttle arm E. Then, the wafer W is transferred from the transfer unit CPL12 to an interface block S3. The transfer units CPL11 and CPL12 serve also as cooling units. In FIG. 12, units with a symbol CPL are cooling units and those with a symbol BF are buffer units.

Figure 13:
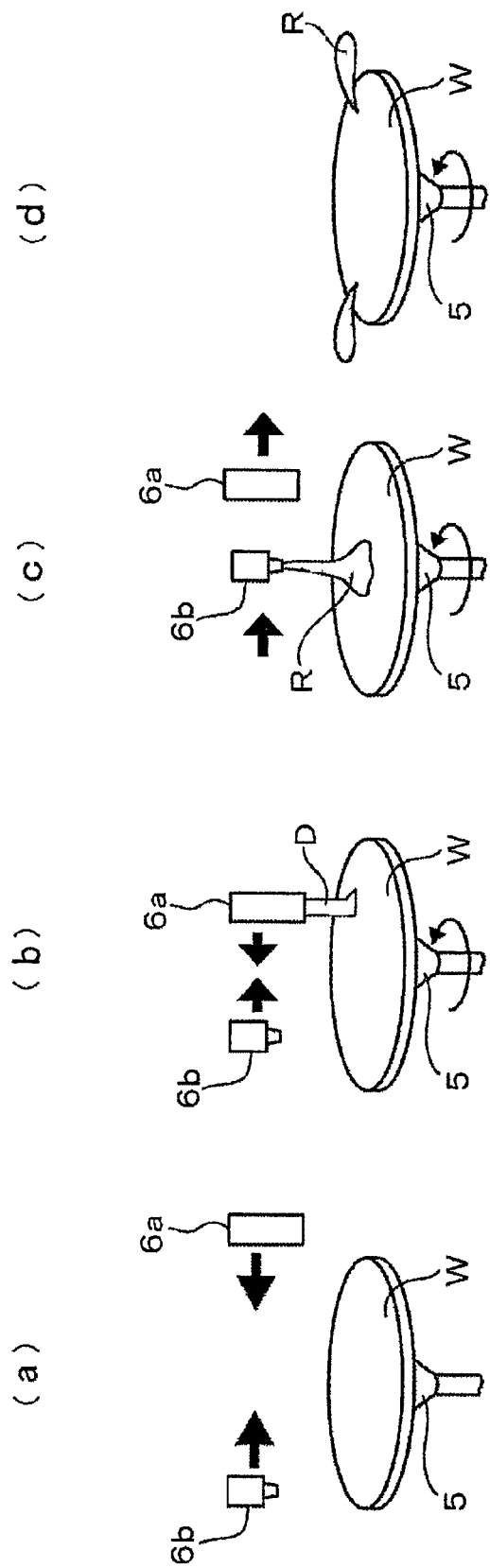
FIGS. 13A, 13B, 13C and 13D are perspective views of a developing module in different steps of a developing process.
Figure 14:
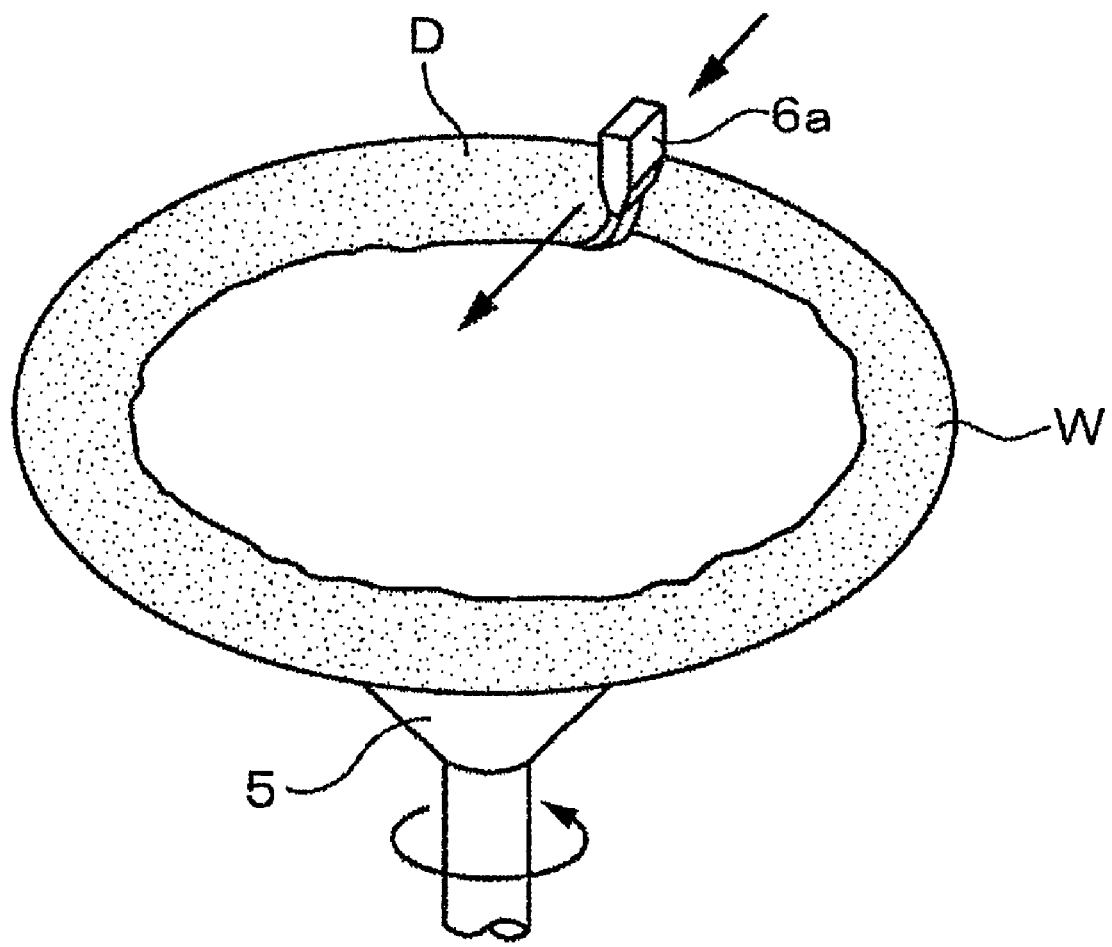
FIG. 14 is a perspective view of assistance in explaining a mode of pouring a developer onto a surface of a wafer.

The developing unit 40 may be provided with a developing nozzle 6a of the following construction for pouring a developer onto a surface of a wafer W. The developing nozzle 6a is provided in its lower wall with a pouring opening having the shape of a slit. The developing nozzle 6a is disposed so that the slit-shaped pouring opening extends along a line extending between a peripheral and a central part of a wafer W. A cleaning nozzle 6b is provided in its lower wall with a pouring opening of a small diameter to pour a cleaning liquid through the pouring opening. The use of the developing nozzle 6a and the cleaning nozzle 6b for processing a wafer W by a developing process will be described. The developing nozzle 6a is positioned at a developer pouring starting position and the cleaning nozzle 6b is positioned at a cleaning liquid pouring starting position as shown in FIG. 13A. Then, as shown in FIG. 13B, the wafer W is rotated about a vertical axis at a predetermined rotating speed, and the developing nozzle 6a discharging a developer D through the pouring opening in the shape of a strip is moved radially inward along a radius of the wafer W. The strip-shaped developer D poured through the pouring opening of the developing nozzle 6a winds closely into the center of the wafer W in a spiral on the surface of the wafer W as typically shown in FIG. 14. Since the wafer W is rotating, the developer D coating the surface of the wafer W is caused to spread radially outward along the surface of the wafer W by centrifugal force. Consequently, a thin developer film is formed on the surface of the wafer W.

On the other hand, for example, the cleaning nozzle 6b starts moving simultaneously with the start of movement of the developer nozzle 6a in a direction opposite a direction in which the developer nozzle 6a moves. The cleaning nozzle 6b moves synchronously with the movement of the developer nozzle 6a to a waiting position near a position where the developer nozzle 6a stops. The waiting position is at a short distance outward with respect to a radial direction from a cleaning liquid pouring position above the center of the wafer W.

The developing nozzle 6a stops discharging the developer after discharging the developer for a predetermined time, and then the developing nozzle 6a is retracted rapidly. Subsequently, as shown in FIG. 13C, the cleaning nozzle 6b is positioned at the cleaning liquid pouring position above the center of the wafer W. Then, the cleaning nozzle 6b starts pouring the cleaning liquid immediately after the developing nozzle 6a has stopped pouring the developer and continues pouring the cleaning liquid onto the surface of the wafer W for a predetermined time. The cleaning liquid poured onto the rotating wafer W is caused to spread over the surface of the wafer W by centrifugal force to clean the surface of the wafer W. Subsequently, the wafer W is rotated at a high rotating speed for spin drying that shakes the cleaning liquid off the wafer W as shown in FIG. 13D after the cleaning nozzle 6b has stopped pouring the cleaning liquid and has been retracted.

What is claimed is:

1. A wet-processing apparatus for processing a substrate held in a horizontal position by pouring a processing solution onto the substrate, said wet-processing apparatus comprising:
 a plurality of processing modules, whose number being an even number not smaller than four, each processing module comprising a substrate holding device for holding a substrate in a horizontal position and a cup surrounding the substrate holding device, the plural processing modules being grouped into plural module groups with each module group comprising plural processing modules;
 a plurality of nozzle devices for pouring processing solutions onto substrates, a respective one of said plurality of nozzle devices being assigned to a respective one of the plural module groups, and each assigned nozzle device being shared by the plural processing modules within the respective module group;
 a plurality of nozzle moving mechanisms each for moving a respective one of said nozzle devices of each module group from one to another of the plural processing modules of the respective module group;
 substrate carrying means for delivering substrates to and receiving substrates from the plural processing modules; and
 a controller for controlling the substrate carrying means such that a succeeding one of the substrates to be successively carried is carried to a processing module of another module group other than the module group to which the substrate preceding the succeeding substrate is delivered,
 wherein each of the plurality of nozzle devices comprises a developing nozzle for pouring a developer onto the substrate to form a developer film and a cleaning nozzle for pouring a cleaning liquid onto the substrate after a passage of a predetermined developing time since coating the developing film; and
 the substrates are delivered to said plural processing modules at a fixed time interval t1, the nozzle device is detained by each processing module to process the substrate for a time t2 covering the predetermined developing time, and the time interval t1 and the time t2 meet an inequality: $t2 > t1$.

2. The wet-processing apparatus according to claim 1, wherein the developing nozzle is a processing solution spouting nozzle for spouting a processing solution for a wet process, and wherein each nozzle moving mechanism includes a moving member holding both the processing solution spouting nozzle and the cleaning nozzle of a respective one of said nozzle devices.

3. The wet-processing apparatus according to claim 1, wherein the plural processing modules of each module group are disposed in one and the same box.

4. The wet-processing apparatus according to claim 1, wherein the substrate carrying means includes a plurality of substrate carriers that are respectively assigned to the plural module groups.

5. The wet-processing apparatus according to claim 1, wherein the plural module groups, each comprising plural processing modules, are superposed.

6. The wet-processing apparatus according to claim 1, wherein the wet process is a developing process for pouring a developer onto a surface of a substrate coated with a resist film and processed by an exposure process.

7. A wet-processing method to be carried out by a wet-processing unit including: a plurality of processing modules, whose number being an even number not smaller than four, each processing module comprising a substrate holding device for holding a substrate in a horizontal position and a cup surrounding the substrate holding device, the plural processing modules being grouped into plural module groups, each module group comprising plural processing modules; a plurality of nozzle devices for pouring processing solutions onto substrates, a respective one of said plurality of nozzle devices being assigned to a respective one of the plural module groups, and each assigned nozzle device being shared by the plural processing modules within the respective module group; said wet-processing method comprising the steps of:

delivering a substrate to a respective one of the processing modules of a first of said plural module groups and holding the delivered substrate with that respective substrate holding device;

pouring a processing solution through one of the nozzle devices onto the delivered substrate to process the substrate by a wet process;

delivering a succeeding substrate to a processing module of a second of said plural module groups, which is other than the first module group including the processing module used for processing the substrate preceding the succeeding substrate, and holding the succeeding substrate by the substrate holding device within the second module group; and processing the succeeding substrate by a wet process by pouring a processing solution onto the succeeding substrate through the nozzle device associated with said second module group, and wherein each of the plurality of nozzle devices of comprises a developing nozzle for pouring a developer onto the substrate to form a developer film and a cleaning nozzle for pouring a cleaning liquid onto the substrate after a passage of a predetermined developing time since coating the developing film; and the substrates are delivered to said plural processing modules at a fixed time interval t1, the nozzle device is detained by each processing module to process the substrate for a time t2 covering the predetermined developing time, and the time interval t1 and the time t2 meet an inequality: t2>t1.

8. The wet-processing method according to claim 7, wherein the developing nozzle is a processing solution spouting nozzle for spouting a processing solution for a wet process, and a moving member is provided for holding both the processing solution spouting nozzle and the cleaning nozzle.

9. The wet-processing method according to claim 7, wherein the plural processing modules of each module group are disposed in one and the same box.

10. A non-transitory storage medium storing a computer program including a set of instructions for a wet-processing apparatus for holding a substrate in a horizontal position by a substrate holding device and processing a substrate by a wet-process by applying a processing solution to the substrate;

wherein the computer program specifies the steps of the wet-processing method according to claim 7.

* * * * *